US012593512B2

(12) United States Patent
Huang

(10) Patent No.: US 12,593,512 B2
(45) Date of Patent: Mar. 31, 2026

(54) ELECTROSTATIC DISCHARGE PROTECTION CIRCUIT

(71) Applicant: Realtek Semiconductor Corporation, Hsinchu (TW)

(72) Inventor: Chung-Yu Huang, Hsinchu (TW)

(73) Assignee: Realtek Semiconductor Corporation, Hsinchu (TW)

( * ) Notice: Subject to any disclaimer, the term of this patent is extended or adjusted under 35 U.S.C. 154(b) by 160 days.

(21) Appl. No.: 18/455,617

(22) Filed: Aug. 24, 2023

(65) Prior Publication Data

US 2024/0222359 A1     Jul. 4, 2024

(30) Foreign Application Priority Data

Dec. 28, 2022 (TW) ................................... 111150339

(51) Int. Cl.
*H10D 89/60* (2025.01)
(52) U.S. Cl.
CPC .................................. *H10D 89/60* (2025.01)
(58) Field of Classification Search
CPC ............................. H10D 89/60; H10D 89/819
USPC ......................................................... 361/56
See application file for complete search history.

(56) References Cited

U.S. PATENT DOCUMENTS

| | | | | |
|---|---|---|---|---|
| 7,221,551 B2* | 5/2007 | Chen | ................... | H10D 89/811 |
| | | | | 361/111 |
| 10,777,547 B2* | 9/2020 | Su | ........................ | H10D 89/819 |
| 2013/0182359 A1* | 7/2013 | Jeon | ...................... | H02H 9/044 |
| | | | | 361/56 |
| 2016/0172350 A1* | 6/2016 | Dey | .................... | H10D 89/819 |
| | | | | 361/56 |
| 2017/0346277 A1* | 11/2017 | Su | ........................ | H10D 89/819 |

* cited by examiner

*Primary Examiner* — Sreeya Sreevatsa
(74) *Attorney, Agent, or Firm* — CKC & Partners Co., LLC

(57) ABSTRACT

An electrostatic discharge protection circuit including a first transistor, a second transistor, a trigger circuit, a time constant circuit and a bias circuit. The second transistor is coupled with the first transistor in series between a first power line and a second power line. The trigger circuit is configured to switch off the second transistor in a normal operation period. The time constant circuit is configured to control the trigger circuit to output an ESD voltage to the first and second transistors in an ESD period, in order to conduct the first and second transistors. The bias circuit is coupled with the first power line and the gate of the first transistor, and is configured to charge the gate of the first transistor in the normal operation period, in order to generate a predetermined voltage difference between the first power line and the gate of the first transistor.

20 Claims, 6 Drawing Sheets

ELECTROSTATIC DISCHARGE PROTECTION CIRCUIT

RELATED APPLICATIONS

This application claims priority to Taiwan Application Serial Number 111150339, filed on Dec. 28, 2022, which is herein incorporated by reference in its entirety.

BACKGROUND

Technical Field

The present disclosure relates to an electrostatic discharge protection circuit. More particularly, the present disclosure relates to an electrostatic discharge protection circuit having the enhanced endurance against the voltage stress.

Description of Related Art

Electrostatic discharge (ESD) will cause permanent damage to the semiconductor components in the integrated circuits due to electrical overstress, thereby affecting the function of the integrated circuit. After packaging, the integrated circuits may encounter ESD events in situations of assembly, testing, storage, handling, etc. Therefore, the integrated circuits on the market are usually implemented with ESD protection circuits. The ESD protection circuit is used to bypass the surge voltage and/or surge current of the ESD event to the low impedance path of the integrated circuit, such as a power line, and therefore the ESD protection circuit is mostly coupled between power lines with different voltages. However, today's integrated circuits require multiple operating voltages to achieve complex functions, so that the voltage difference between the power lines coupled to the ESD protection circuit may exceed the voltage that the ESD protection circuit can withstand, thereby reducing the reliability of the ESD protection circuit.

SUMMARY

The disclosure provides an electrostatic discharge (ESD) protection circuit including a first transistor, a second transistor, a trigger circuit, a time constant circuit and a bias circuit. The second transistor is coupled with the first transistor in series between a first power line and a second power line. The trigger circuit is configured to switch off the second transistor in a normal operation period. The time constant circuit is coupled with the trigger circuit, and is configured to control the trigger circuit to output an ESD voltage to a gate of the first transistor and a gate of the second transistor in an ESD period, in order to conduct the first transistor and the second transistor. The bias circuit is coupled with the first power line and the gate of the first transistor, and is configured to charge the gate of the first transistor in the normal operation period, in order to generate a predetermined voltage difference between the first power line and the gate of the first transistor.

The disclosure provides an ESD protection circuit including a clamping circuit, a trigger circuit, a time constant circuit and a bias circuit. The clamping circuit includes a first control terminal, a second control terminal, a first voltage input terminal and a second voltage input terminal. The first voltage input terminal and the second voltage input terminal are configured to respectively receive a high operating voltage and a low operating voltage in a normal operation period. The trigger circuit is configured to output the low operating voltage to the second control terminal in the normal operation period to switch off the clamping circuit. The time constant circuit is coupled with the trigger circuit, and is configured to control the trigger circuit to output an ESD voltage to the first control terminal and the second control terminal in an ESD period, in order to conduct the clamping circuit to discharge an ESD current through the clamping circuit. The bias circuit is coupled with the first voltage input terminal and the first control terminal, and is configured to charge the first control terminal in the normal operation period according to the high operating voltage, in order to generate a predetermined voltage difference between the first voltage input terminal and the first control terminal.

It is to be understood that both the foregoing general description and the following detailed description are by examples, and are intended to provide further explanation of the disclosure as claimed.

DETAILED DESCRIPTION

Figure 1:
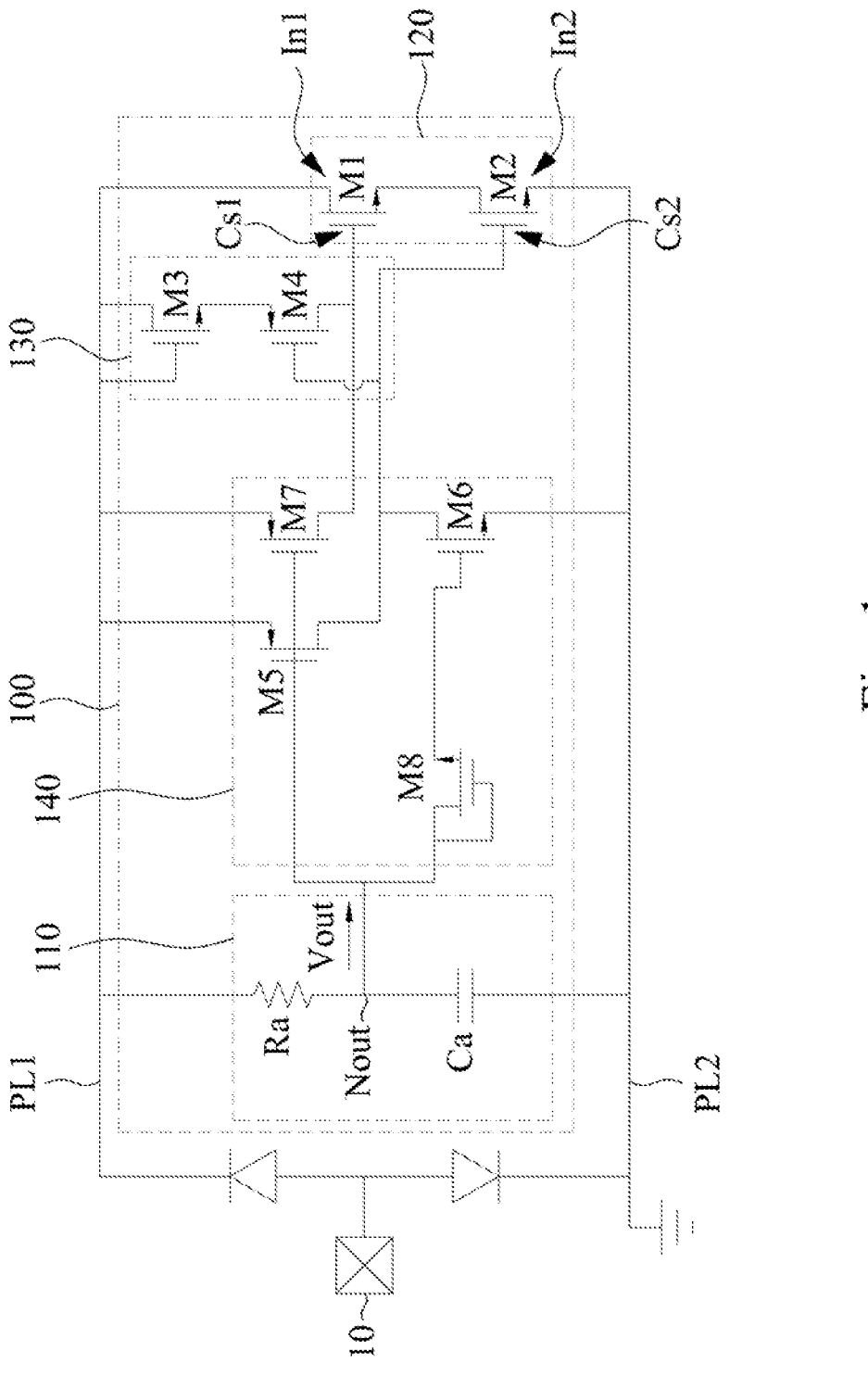
FIG. 1 is a functional block diagram of an electrostatic discharge (ESD) protection circuit according to one embodiment of the present disclosure.

Reference will now be made in detail to the present embodiments of the disclosure, examples of which are illustrated in the accompanying drawings. Wherever possible, the same reference numbers are used in the drawings and the description to refer to the same or like parts.

FIG. 1 is a functional block diagram of an electrostatic discharge (ESD) protection circuit 100 according to one embodiment of the present disclosure. The ESD protection circuit 100 comprises a time constant circuit 110, a clamping circuit 120, a bias circuit 130 and a trigger circuit 140. The ESD protection circuit 100 is coupled between a first power line PL1 and a second power line PL2. In some embodiments, the first power line PL1, the second power line PL2 and the ESD protection circuit 100 form part of an integrated circuit, and the first power line PL1 and the second power line PL2 are capable of supplying power to an internal circuit (not shown) of the integrated circuit. In some embodiments, the ESD protection circuit 100 is coupled to an input/output pin 10 of the integrated circuit through the first power line PL1 and the second power line PL2. Therefore, the ESD protection circuit 100 can prevent the internal circuit of the integrated circuit from being damaged by ESD voltages and/or currents on the first power line PL1, the second power line PL2 and the input/output pin 10.

Figure 2:
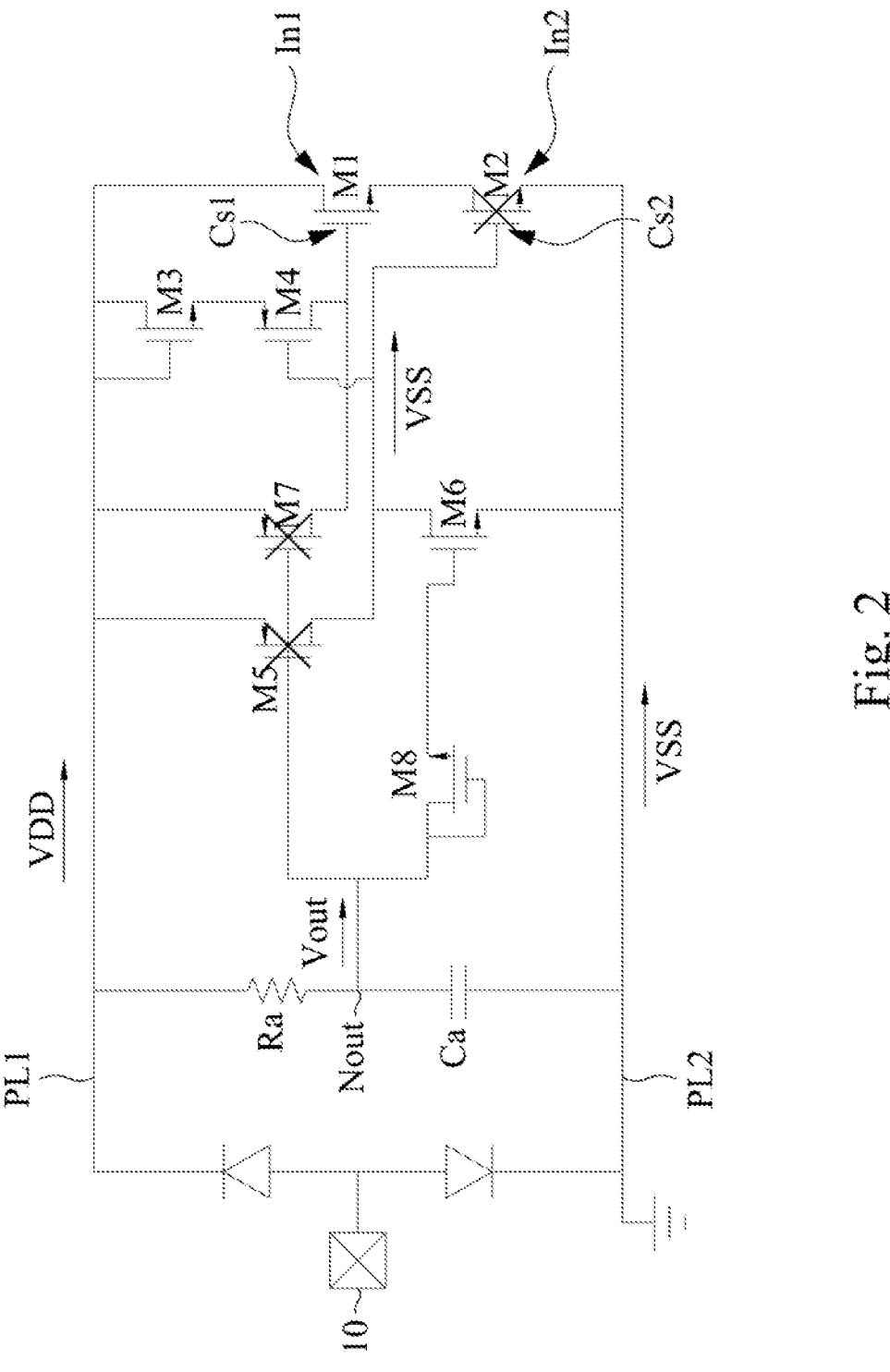
FIG. 2 is a schematic diagram for illustrating the operation of the ESD protection circuit of FIG. 1 in the normal operation period of the integrated circuit.

In some embodiments, in a normal operation period of the integrated circuit (e.g., a period that the first power line PL1 and the second power line PL2 receive stable voltage from an external power source), the first power line PL1 has a high operating voltage VDD and the second power line PL2 has a low operating voltage VSS (the high operating voltage VDD and the low operating voltage VSS are depicted in FIG. 2). In one embodiment, the second power line PL2 is grounded.

The circuit structure of the ESD protection circuit 100 is discussed first in the following. The time constant circuit 110 comprises a resistor Ra, a capacitor Ca and an output node Nout. The resistor Ra is coupled between the first power line PL1 and the output node Nout. The capacitor Ca is coupled between the output node Nout and the second power line PL2. The resistance of the resistor Ra and the capacitance of the capacitor Ca forms a time constant. The output node Nout is configured to provide an output voltage Vout.

The clamping circuit 120 comprises a first control terminal Cs1, a second control terminal Cs2, a first voltage input terminal In1 and a second voltage input terminal In2. The first voltage input terminal In1 and the second voltage input terminal In2 are respectively coupled with the first power line PL1 and the second power line PL2, so as to respectively receive the high operating voltage VDD and the low operating voltage VSS in the normal operation period. The trigger circuit 140 may control the clamping circuit 120 between a conducted state and a switched-off state through the first control terminal Cs1 and the second control terminal Cs2. The conducted state may represent that the clamping circuit 120 forms a short circuit between the first power line PL1 and the second power line PL2. The switched-off state may represent that the clamping circuit 120 disconnects the first power line PL1 and the second power line PL2, which will be discussed in greater detail in the following paragraphs.

The clamping circuit 120 further comprises a first transistor M1 and a second transistor M2, in which the first transistor M1 and the second transistor M2 are coupled in series between the first power line PL1 and the second power line PL2. A drain and a gate of the first transistor M1 are the first voltage input terminal In1 and the first control terminal Cs1, respectively. A drain of the second transistor M2 is coupled with a source of the first transistor M1. A source and a gate of the second transistor M2 are the second voltage input terminal In2 and the second control terminal Cs2, respectively.

The bias circuit 130 is coupled with the first power line PL1 and the gate of the first transistor M1. The bias circuit 130 comprises a third transistor M3 and a fourth transistor M4, in which the third transistor M3 and the fourth transistor M4 are coupled in series between the first power line PL1 and the gate of the first transistor M1. Specifically, a drain and a gate of the third transistor M3 are configured to receive the high operating voltage VDD from the first power line PL1 in the normal operation period. A source of the fourth transistor M4 is coupled with a source of the third transistor M3. A drain of the fourth transistor M4 is coupled with the gate of the first transistor M1. A gate of the fourth transistor M4 is coupled with the gate of the second transistor M2.

The trigger circuit 140 is coupled with the time constant circuit 110, the clamping circuit 120, and the bias circuit 130. The trigger circuit 140 comprises a fifth transistor M5, a sixth transistor M6, a seventh transistor M7 and an eighth transistor M8. The fifth transistor M5 and the sixth transistor M6 are coupled in series between the first power line PL1 and the second power line PL2. The seventh transistor M7 is coupled between the first power line PL1 and the gate of the first transistor M1. The eighth transistor M8 is coupled between the time constant circuit 110 and a gate of the sixth transistor M6, in which the eighth transistor M8 is a diode-connected transistor. Gates of the fifth transistor M5 and the seventh transistor M7 are configured to receive the output voltage Vout from the time constant circuit 110. The gate of the sixth transistor M6 is configured to receive the output voltage Vout through the eighth transistor M8.

Specifically, a source of the fifth transistor M5 is configured to receive the high operating voltage VDD in the normal operation period. The gate of the fifth transistor M5 is coupled with the output node Nout. A drain of the sixth transistor M6 is coupled with a drain of the fifth transistor M5. A source of the sixth transistor M6 is configured to receive the low operating voltage VSS in the normal operation period. The gate of the sixth transistor M6 is coupled with a source of the eighth transistor M8, in which a gate and a drain of the eighth transistor M8 are coupled with the output node Nout. A source of the seventh transistor M7 is configured to receive the high operating voltage VDD in the normal operation period. The gate of the seventh transistor M7 is coupled with the output node Nout. A drain of the seventh transistor M7 is coupled with the gate of the first transistor M1.

In some embodiments, the first transistor M1, the second transistor M2, the third transistor M3, the sixth transistor M6 and the eighth transistor M8 may be implemented using N-type transistors. The fourth transistor M4, the fifth transistor M5 and the seventh transistor M7 may be implemented by using P-type transistors.

FIG. 2 is a schematic diagram for illustrating the operation of the ESD protection circuit 100 of FIG. 1 in the normal operation period of the integrated circuit. The operation of the ESD protection circuit 100 in the normal operation period of the integrated circuit is discussed in the following with reference to FIG. 2. In the normal operation period, the output voltage Vout of the time constant circuit 110 is the same as the high operating voltage VDD, and therefore the time constant circuit 110 uses the output voltage Vout to control the trigger circuit 140 to output the low operating voltage VSS to the second control terminal Cs2, in order to switch off the clamping circuit 120. Specifically, the fifth transistor M5 and the seventh transistor M7 are switched off, and the sixth transistor M6 and the eighth transistor M8 are conducted. As a result, the gate of the second transistor M2 is set to the low operating voltage VSS so that the second transistor M2 is switched off.

In addition, the fourth transistor M4 is conducted by the low operating voltage VSS outputted by the trigger circuit 140, and therefore, the bias circuit 130 charges the first control terminal Cs1 according to the high operating voltage VDD, so as to generate a predetermined voltage difference between the first voltage input terminal In1 (or the first power line PL1) and the first control terminal Cs1 (or the gate of the first transistor M1). Specifically, the bias circuit 130 charges the gate of the first transistor M1 to VDD-Vth3, so that the first transistor M1 is conducted. "Vth3" represents the threshold voltage of the third transistor M3, that is, the aforementioned predetermined voltage difference is the threshold voltage of the third transistor M3.

As a result, the bias circuit 130 mitigates the voltage stress applied to the first transistor M1, and the first transistor M1 reduces the voltage stress applied to the second transistor M2. For example, in a situation that the high operating voltage VDD is 1.2 V and the low operating voltage VSS is 0 V, the gate voltage of the first transistor M1 is about 0.9

V and the source voltage of the first transistor M1 is about 0.6V. That is, the voltage difference between any two terminals of the first transistor M1 is smaller than 1 V, which is the same for the second transistor M2 through the fourth transistor M4. Therefore, when the first transistor M1 through the fourth transistor M4 are implemented using the transistors of advanced processes having lower voltage endurance (e.g., the voltage endurance of 1 V), the ESD protection circuit 100 still has high reliability.

In addition, the eighth transistor M8 charges the gate of the sixth transistor M6 to VDD-Vth8, in which "Vth8" represents the threshold voltage of the eighth transistor M8. Therefore, the eighth transistor M8 reduces the voltage stress applied to the sixth transistor M6, so that the sixth transistor M6 and the eighth transistor M8 can be implemented using the transistors of advanced processes. It helps to reduce the overall circuit area of the ESD protection circuit 100 by implementing the ESD protection circuit 100 using the transistors of advanced processes.

In some embodiments, gates of the fifth transistor M5 and the seventh transistor M7 are coupled to the source of the eighth transistor M8. In this situation, the eighth transistor M8 mitigates the voltage stress applied to the fifth transistor M5 and the seventh transistor M7, and therefore the fifth transistor M5 and the seventh transistor M7 can be implemented using the transistors of advanced processes.

Figure 3:
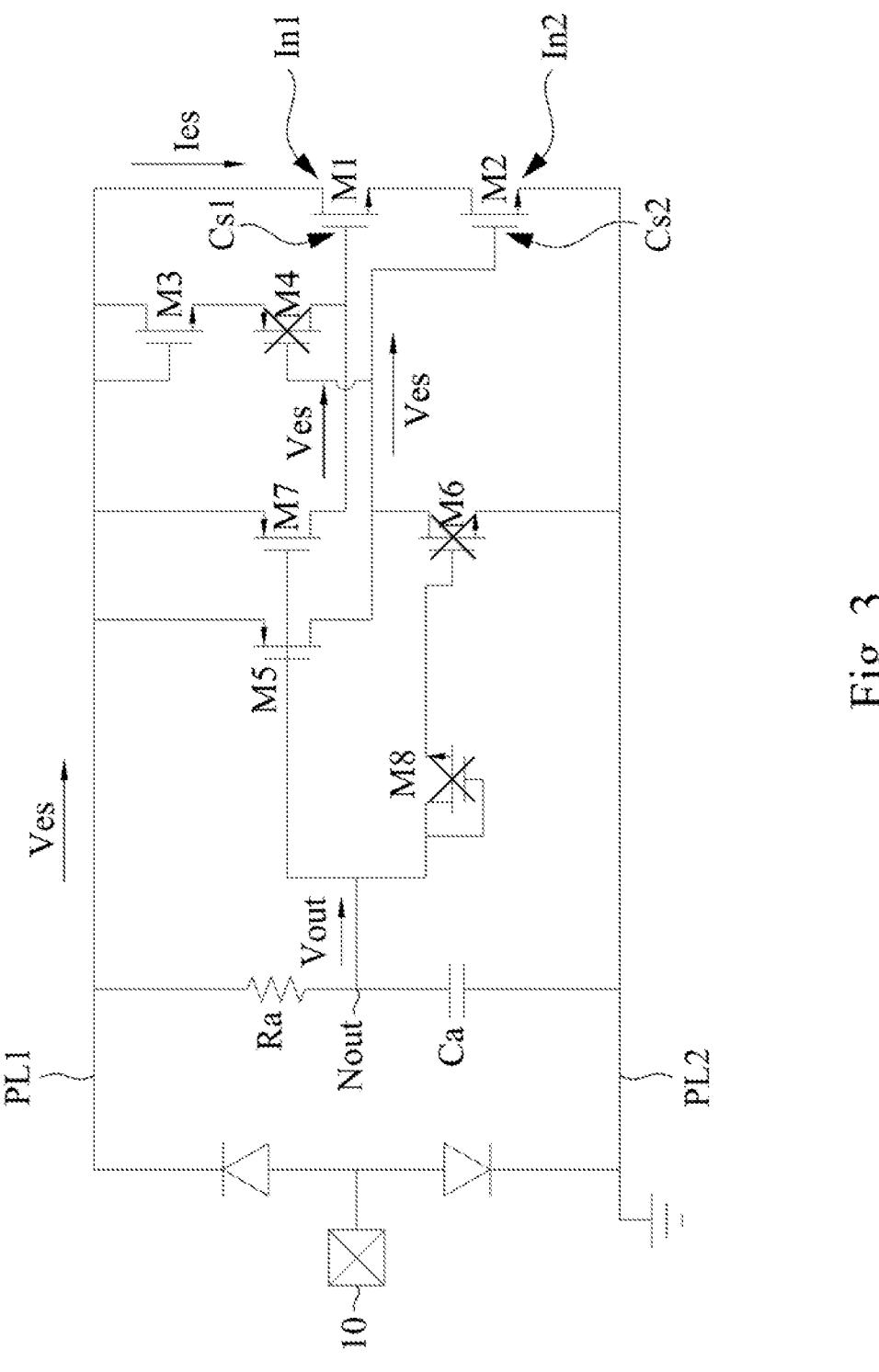
FIG. 3 is a schematic diagram for illustrating the operation of the ESD protection circuit of FIG. 1 in the ESD period.

FIG. 3 is a schematic diagram for illustrating the operation of the ESD protection circuit 100 of FIG. 1 in the ESD period. The operation of the ESD protection circuit 100 in the ESD period is discussed in the following with reference to FIG. 3. In the ESD period, the output voltage Vout of the time constant circuit 110 temporarily remains at approximately 0 V. Therefore, the time constant circuit 110 uses the output voltage Vout to control the trigger circuit 140 to output an ESD voltage Ves to the first control terminal Cs1 and the second control terminal Cs2, in order to conduct the clamping circuit 120, so that the ESD current Ies is discharged through the clamping circuit 120.

Specifically, in the ESD period, the fifth transistor M5 and the seventh transistor M7 are conducted, and the sixth transistor M6 and the eighth transistor M8 are switched off. Therefore, the ESD voltage Ves is transmitted from the first power line PL1 to the gate of the first transistor M1 and the gate of the second transistor M2, so that the first transistor M1 and the second transistor M2 are conducted. In addition, the fourth transistor M4 is also switched off due to the ESD voltage Ves received by the gate thereof. Therefore, the ESD current Ies discharges from the first power line PL1 to the second power line PL2, through the first transistor M1 and the second transistor M2.

Figure 4:
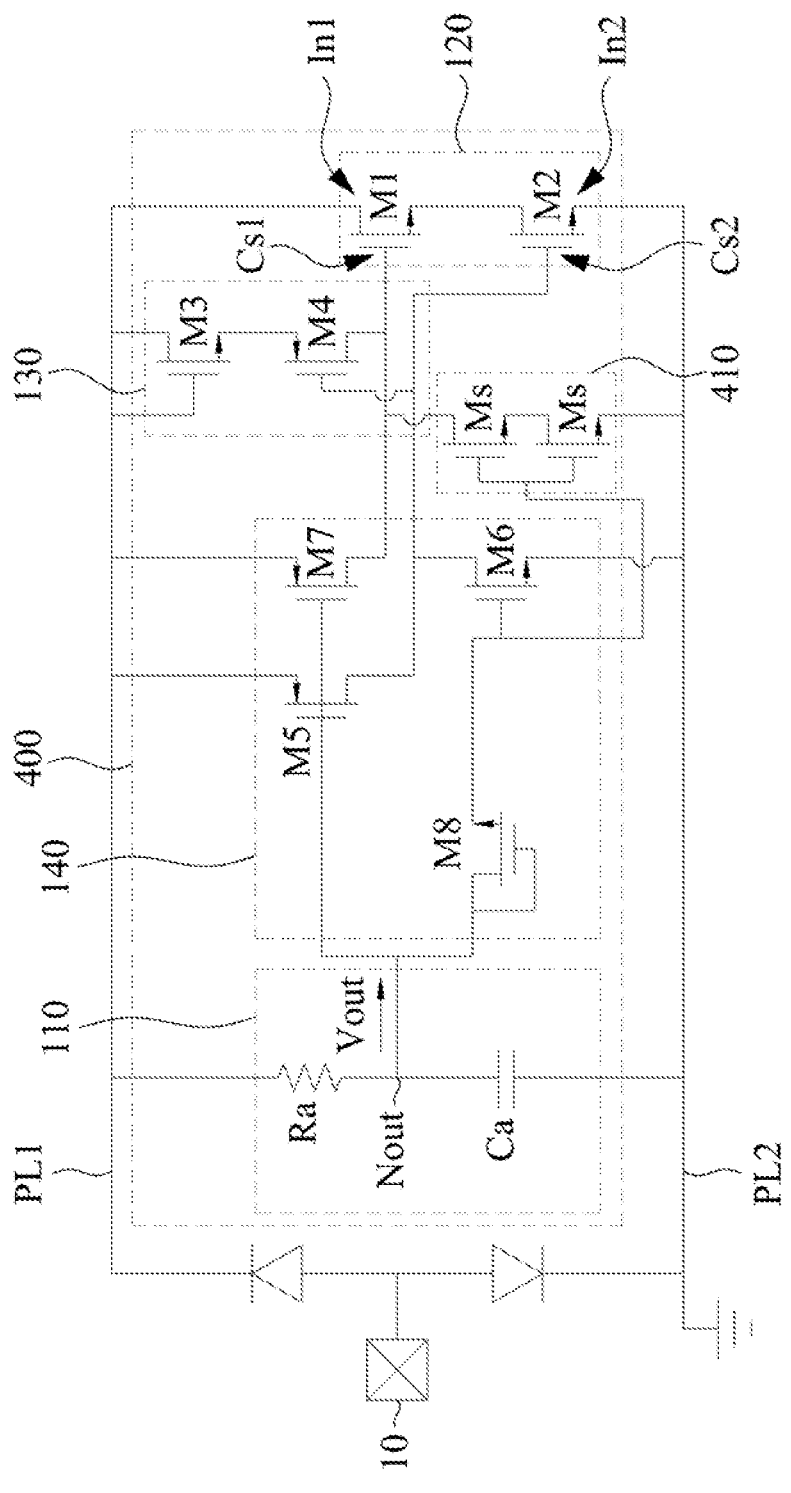
FIG. 4 is a functional block diagram of an ESD protection circuit according to one embodiment of the present disclosure.

FIG. 4 is a functional block diagram of an ESD protection circuit 400 according to one embodiment of the present disclosure. The ESD protection circuit 400 have components, connection relationships and operations similar to that of the aforementioned ESD protection circuit 100, and therefore only the differences between the ESD protection circuits 100 and 400 are discussed in the following.

The ESD protection circuit 400 further comprises a pull-down circuit 410. The pull-down circuit 410 is coupled between the gate of the first transistor M1 and the second power line PL2. In the normal operation period, the pull-down circuit 410 discharges the gate of the first transistor M1 to the second power line PL2 according to the low operating voltage VSS, and the pull-down circuit 410 is switched off in the ESD period.

In some embodiments, as shown in FIG. 4, the pull-down circuit 410 comprises a series-coupled transistor structure.

The series-coupled transistor structure has a first terminal coupled with the gate of the first transistor M1, and has a second terminal coupled with the second power line PL2 to receive the low operating voltage VSS. The series-coupled transistor structure has a plurality of voltage-stabilizing transistors Ms having gates coupled to the gate of the sixth transistor M6 to receive the output voltage Vout, in which the voltage-stabilizing transistors Ms may be implemented using the N-type transistors. The voltage-stabilizing transistors Ms are conducted in the normal operation period to prevent the gate of the first transistor M1 from floating, so as to stabilize the gate voltage of the first transistor M1 at a value slightly lower than VDD-Vth3. As a result, in the normal operation period, the gate voltage of the first transistor M1 has no fluctuation, so that the voltage stress of the first transistor M1 is further ensured to be within the range that the first transistor M1 can endure. In addition, the voltage-stabilizing transistors Ms are switched off in the ESD period.

In other embodiments, the pull-down circuit 410 comprises a plurality of diodes coupled in series between the gate of the first transistor M1 and the second power line PL2 (not shown, hereinafter referred to as the "series-coupled diode structure"). The series-coupled diode structure has a first terminal coupled with the gate of the first transistor M1, and a second terminal of the series-coupled diode structure is configured to receive the low operating voltage VSS. The series-coupled diode structure has operations and advantages similar to that of the series-coupled transistor structure, and therefore the detail descriptions are omitted here.

Figure 5:
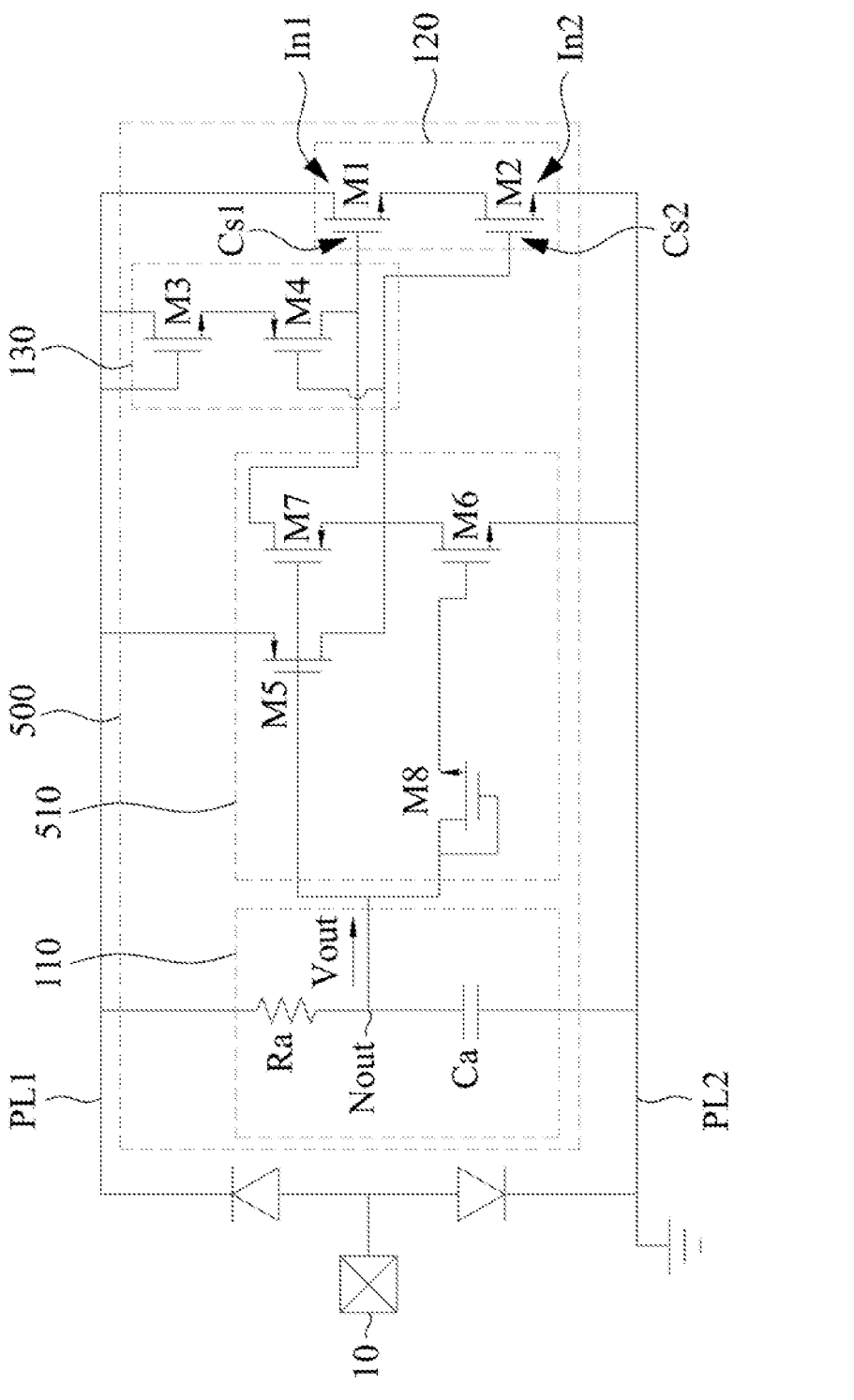
FIG. 5 is a functional block diagram of an ESD protection circuit according to one embodiment of the present disclosure.

FIG. 5 is a functional block diagram of an ESD protection circuit 500 according to one embodiment of the present disclosure. The ESD protection circuit 500 has components, connection relationships and operations similar to that of the aforementioned ESD protection circuit 100, and therefore only the differences between the ESD protection circuits 100 and 500 are discussed in the following.

The trigger circuit 510 of the ESD protection circuit 500 is different from the trigger circuit 140. The difference between the trigger circuit 510 and the trigger circuit 140 is the connection of the seventh transistor M7. Specifically, the sixth transistor M6 and the seventh transistor M7 of the trigger circuit 510 are coupled in series between the gate of the first transistor M1 and the second power line PL2. The drain of the seventh transistor M7 is coupled with the gate of the first transistor M1; the source of the seventh transistor M7 is coupled with the gate of the second transistor M2, the drain of the fifth transistor M5 and the drain of the sixth transistor M6; and the gate of the seventh transistor M7 is configured to receive the output voltage Vout from the output node Nout.

The seventh transistor M7 of the trigger circuit 510 is switched off in the normal operation period, and is conducted in the ESD period to transmit the ESD voltage Ves to the first control terminal Cs1. The other components, connection relationships and operations of the trigger circuit 510 of FIG. 5 are similar to that of the trigger circuit 140 of FIG. 1, and therefore the detailed descriptions are omitted here.

Figure 6:
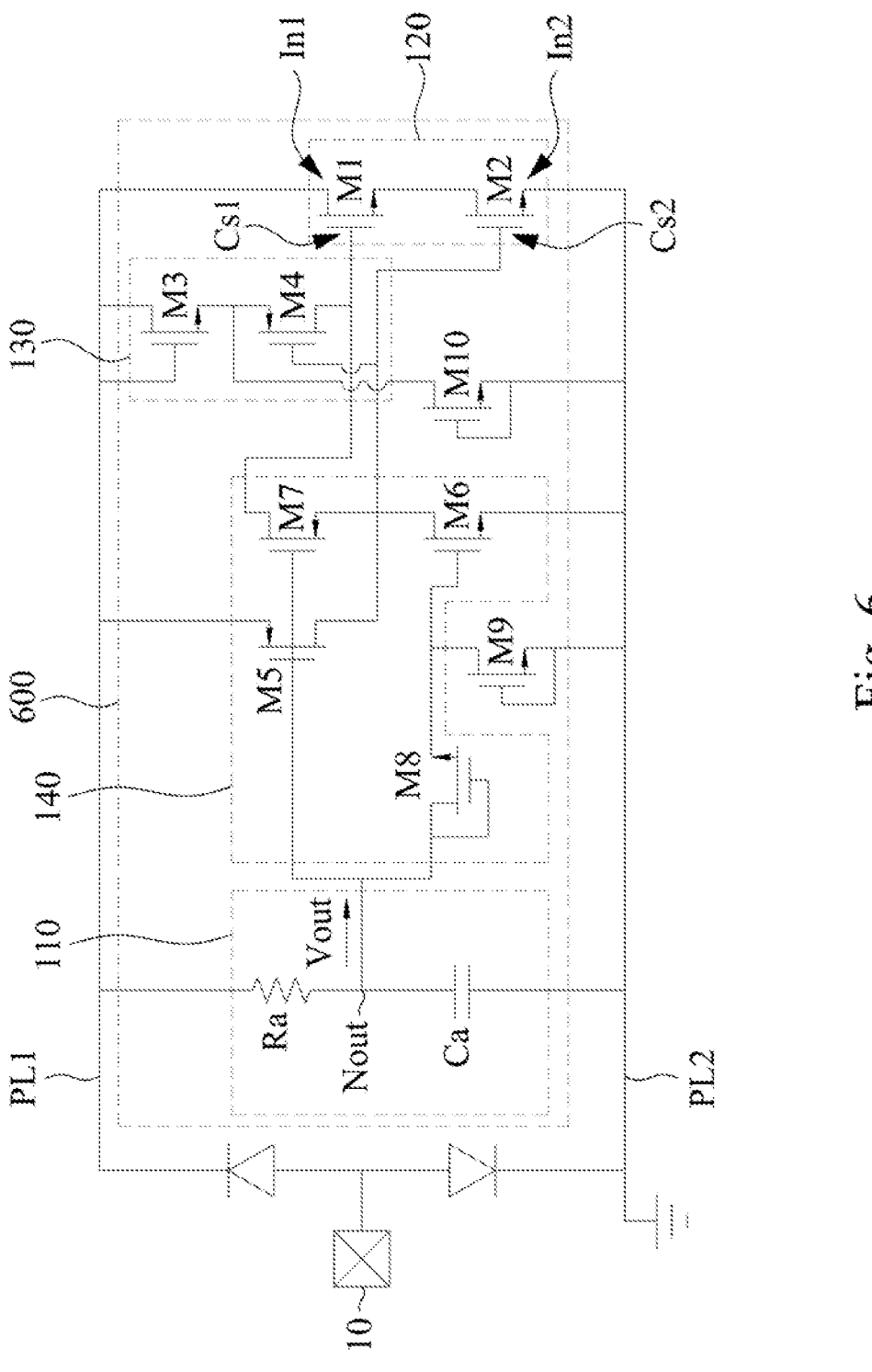
FIG. 6 is a functional block diagram of an ESD protection circuit according to one embodiment of the present disclosure.

FIG. 6 is a functional block diagram of an ESD protection circuit 600 according to one embodiment of the present disclosure. The ESD protection circuit 600 have components, connection relationships and operations similar to that of the aforementioned ESD protection circuit 500, and therefore only the differences between the ESD protection circuits 500 and 600 are discussed in the following.

The ESD protection circuit 600 further comprises a ninth transistor M9 and a tenth transistor M10. In some embodiments, the ninth transistor M9 and the tenth transistor M10 may be implemented using N-type transistors. The ninth transistor M9 is coupled between the gate of the sixth transistor M6 and the second power line PL2. A gate of the ninth transistor M9 is coupled with the second power line PL2. The tenth transistor M10 and the third transistor M3 are coupled in series between the first power line PL1 and the second power line PL2. A gate of the tenth transistor M10 is coupled with the second power line PL2.

Specifically, a drain of the ninth transistor M9 is coupled with the gate of the sixth transistor M6. A source and the gate of the ninth transistor M9 are configured to receive the low operating voltage VSS from the second power line PL2. A drain of the tenth transistor M10 is coupled with the source of the third transistor M3 and the source of the fourth transistor M4. A source and the gate of the tenth transistor M10 is configured to receive a low operating voltage VSS from the second power line PL2.

In the normal operation period and the ESD period, the ninth transistor M9 and the tenth transistor M10 are switched off. The ninth transistor M9 generates a leakage current flowing from the gate of the sixth transistor M6 to the second power line PL2, in order to prevent the gate of the sixth transistor M6 from floating, so that the gate voltage of the sixth transistor M6 is stabilized. The tenth transistor M10 generates a leakage current flowing from the source of the fourth transistor M4 to the second power line PL2, in order to prevent the gate of the first transistor M1 from floating, so that the gate voltage of the first transistor M1 is stabilized. As such, in the normal operation period, the gate voltages of the first transistor M1 and the sixth transistor M6 has no fluctuation, so that the voltage stresses of the first transistor M1 and the sixth transistor M6 are further ensured to be within the range that the first transistor M1 and the sixth transistor M6 can endure.

In some embodiments, each third transistor M3 of the ESD protection circuits 100, 400, 500 and 600 in FIG. 1 through FIG. 6 can be replaced by a plurality of diodes coupled in series. The fourth transistor M4 and the plurality of diodes are coupled in series between the first power line PL1 and the gate of the first transistor M1. Specifically, the plurality of diodes are coupled in series between the first power line PL1 and the source of the fourth transistor M4. The drain of the fourth transistor M4 is coupled with the gate of the first transistor M1. The gate of the fourth transistor M4 is coupled with the gate of the second transistor M2 and the drain of the fifth transistor M5.

In some embodiments, each eighth transistor M8 of the ESD protection circuits 100, 400, 500 and 600 of FIG. 1 through FIG. 6 may be omitted, and the gate of the sixth transistor M6 may be directly coupled to the output node Nout. In this situation, the sixth transistor M6 may be implemented by the transistor of mature processes that has higher voltage endurance.

In some embodiments, each of the ESD protection circuits 100, 400 and 500 of FIG. 1 through FIG. 5 may have the ninth transistor M9 and the tenth transistor M10 being configured in the manner shown in FIG. 6, that is, providing the leakage current to the gate of the sixth transistor M6 by the ninth transistor M9 and providing the leakage current to the source of the fourth transistor M4 by the tenth transistor M10.

As can be appreciated from the above, the ESD protection circuits 100, 400, 500 and 600 have the enhanced endurance against the voltage stress, and therefore are suitable for today's integrated circuits using a variety of operating voltages.

Certain terms are used in the specification and the claims to refer to specific components. However, those of ordinary skill in the art would understand that the same components may be referred to by different terms. The specification and claims do not use the differences in terms as a way to distinguish components, but the differences in functions of the components are used as a basis for distinguishing. Furthermore, it should be understood that the term "comprising" used in the specification and claims is open-ended, that is, including but not limited to. In addition, "coupling" herein includes any direct and indirect connection means. Therefore, if it is described that the first component is coupled to the second component, it means that the first component can be directly connected to the second component through electrical connection or signal connections including wireless transmission, optical transmission, and the like, or the first component is indirectly electrically or signally connected to the second component through other component(s) or connection means.

Unless the context clearly dictates otherwise, the singular terms used herein include plural referents.

Although the present disclosure has been described in considerable detail with reference to certain embodiments thereof, other embodiments are possible. Therefore, the spirit and scope of the appended claims should not be limited to the description of the embodiments contained herein. It will be apparent to those skilled in the art that various modifications and variations can be made to the structure of the present disclosure without departing from the scope or spirit of the present disclosure. In view of the foregoing, it is intended that the present disclosure cover modifications and variations of this disclosure provided they fall within the scope of the following claims and their equivalents.

What is claimed is:

1. An electrostatic discharge (ESD) protection circuit, comprising:

a first transistor;

a second transistor, coupled with the first transistor in series between a first power line and a second power line;

a trigger circuit, configured to switch off the second transistor in a normal operation period;

a time constant circuit, coupled with the trigger circuit, configured to control the trigger circuit to output an ESD voltage to a gate of the first transistor and a gate of the second transistor in an ESD period, in order to conduct the first transistor and the second transistor; and a bias circuit, coupled with the first power line and the gate of the first transistor, configured to charge the gate of the first transistor in the normal operation period, in order to generate a predetermined voltage difference between the first power line and the gate of the first transistor, wherein the bias circuit comprises:

a third transistor; and a fourth transistor, coupled with the third transistor in series between the first power line and the gate of the first transistor;

wherein a source of the fourth transistor is directly electrically connected to a source of the third transistor.

2. The ESD protection circuit of claim 1,
wherein a gate of the third transistor is coupled with the first power line, a gate of the fourth transistor is coupled with the trigger circuit.

3. The ESD protection circuit of claim 1, wherein the trigger circuit comprises:
a fifth transistor;
a sixth transistor, coupled with the fifth transistor in series between the first power line and the second power line; and
a seventh transistor, coupled between the first power line and the gate of the first transistor,
wherein a gate of the fifth transistor, a gate of the sixth transistor and a gate of the seventh transistor are configured to receive an output voltage of the time constant circuit.

4. The ESD protection circuit of claim 3, further comprising:
a pull-down circuit, coupled between the gate of the first transistor and the second power line,
wherein in the normal operation period, the pull-down circuit discharges the gate of the first transistor to the second power line,
wherein in the ESD period, the pull-down circuit is switched off.

5. The ESD protection circuit of claim 4, wherein the pull-down circuit comprises:
a series-coupled transistor structure, coupled between the gate of the first transistor and the second power line, wherein gates of a plurality of voltage-stabilizing transistors of the series-coupled transistor structure are coupled with the gate of the sixth transistor to receive the output voltage.

6. The ESD protection circuit of claim 4, wherein the pull-down circuit comprises:
a plurality of diodes, coupled in series between the gate of the first transistor and the second power line.

7. The ESD protection circuit of claim 1, wherein the trigger circuit comprises:
a fifth transistor;
a sixth transistor, coupled with the fifth transistor in series between the first power line and the second power line; and
a seventh transistor, coupled with the sixth transistor in series between the gate of the first transistor and the second power line,
wherein a gate of the fifth transistor, a gate of the sixth transistor and a gate of the seventh transistor are configured to receive an output voltage of the time constant circuit.

8. The ESD protection circuit of claim 7, wherein the trigger circuit further comprises:
an eighth transistor, coupled between the time constant circuit and the gate of the sixth transistor, configured to transmit the output voltage of the time constant circuit to the gate of the sixth transistor, wherein the eighth transistor is a diode-connected transistor.

9. The ESD protection circuit of claim 7, further comprising:
a ninth transistor, coupled between the gate of the sixth transistor and the second power line, wherein a gate of the ninth transistor is coupled with the second power line; and
a tenth transistor, coupled with the third transistor in series between the first power line and the second power line, wherein a gate of the tenth transistor is coupled with the second power line.

10. The ESD protection circuit of claim 1, wherein the bias circuit comprises:
a plurality of diodes, connected in series; and
a fourth transistor, coupled with the plurality of diodes in series between the first power line and the gate of the first transistor, wherein a gate of the fourth transistor is coupled with the trigger circuit.

11. An electrostatic discharge (ESD) protection circuit, comprising:
a clamping circuit, comprising a first control terminal, a second control terminal, a first voltage input terminal and a second voltage input terminal, wherein the first voltage input terminal and the second voltage input terminal are configured to respectively receive a high operating voltage and a low operating voltage in a normal operation period;
a trigger circuit, configured to output the low operating voltage to the second control terminal in the normal operation period to switch off the clamping circuit;
a time constant circuit, coupled with the trigger circuit, configured to control the trigger circuit to output an ESD voltage to the first control terminal and the second control terminal in an ESD period, in order to conduct the clamping circuit to discharge an ESD current through the clamping circuit; and
a bias circuit, coupled with the first voltage input terminal and the first control terminal, configured to charge the first control terminal in the normal operation period according to the high operating voltage, in order to generate a predetermined voltage difference between the first voltage input terminal and the first control terminal, wherein the bias circuit comprises:
a third transistor; and
a fourth transistor, coupled with the third transistor in series;
wherein a source of the fourth transistor is directly electrically connected to a source of the third transistor.

12. The ESD protection circuit of claim 11, wherein the clamping circuit comprises:
a first transistor, wherein a drain of the first transistor is the first voltage input terminal, and a gate of the first transistor is the first control terminal; and
a second transistor, wherein a drain of the second transistor is coupled with a source of the first transistor, a source of the second transistor is the second voltage input terminal, a gate of the second transistor is the second control terminal.

13. The ESD protection circuit of claim 12, wherein a drain and a gate of the third transistor are configured to receive the high operating voltage in the normal operation period, wherein a drain of the fourth transistor is coupled with the gate of the first transistor, a gate of the fourth transistor is coupled with the gate of the second transistor.

14. The ESD protection circuit of claim 13, wherein the trigger circuit comprises:
a fifth transistor, wherein a source of the fifth transistor is configured to receive the high operating voltage in the normal operation period;
a sixth transistor, wherein a drain of the sixth transistor is coupled with a drain of the fifth transistor, a source of the sixth transistor is configured to receive the low operating voltage in the normal operation period; and
a seventh transistor, wherein a drain of the seventh transistor is coupled with the gate of the first transistor, a source of the seventh transistor is configured to receive the high operating voltage in the normal operation period, wherein a gate of the fifth transistor, a gate of the sixth transistor and a gate of the seventh transistor are configured to receive an output voltage of the time constant circuit.

15. The ESD protection circuit of claim 14, further comprising:

a pull-down circuit, coupled with the gate of the first transistor, wherein in the normal operation period, the pull-down circuit discharges the gate of the first transistor according to the low operating voltage, wherein in the ESD period, the pull-down circuit is switched off.

16. The ESD protection circuit of claim 15, wherein the pull-down circuit comprises:

a series-coupled transistor structure, wherein a first terminal of the series-coupled transistor structure is coupled with the gate of the first transistor, a second terminal of the series-coupled transistor structure is configured to receive the low operating voltage in the normal operation period, wherein gates of a plurality of voltage-stabilizing transistors of the series-coupled transistor structure are coupled with the gate of the sixth transistor to receive the output voltage.

17. The ESD protection circuit of claim 15, wherein the pull-down circuit comprises:

a series-coupled diode structure, wherein a first terminal of the series-coupled diode structure is coupled with the gate of the first transistor, a second terminal of the series-coupled diode structure is configured to receive the low operating voltage in the normal operation period.

18. The ESD protection circuit of claim 13, wherein the trigger circuit comprises:

a fifth transistor, wherein a source of the fifth transistor is configured to receive the high operating voltage in the normal operation period;

a sixth transistor, wherein a drain of the sixth transistor is coupled with a drain of the fifth transistor, a source of the sixth transistor is configured to receive the low operating voltage in the normal operation period; and a seventh transistor, wherein a source of the seventh transistor is coupled with the drain of the sixth transistor, a drain of the seventh transistor is coupled with the gate of the first transistor, wherein a gate of the fifth transistor, a gate of the sixth transistor and a gate of the seventh transistor are configured to receive an output voltage of the time constant circuit.

19. The ESD protection circuit of claim 18, wherein the trigger circuit further comprises:

an eighth transistor, coupled between the time constant circuit and the gate of the sixth transistor, configured to transmit the output voltage of the time constant circuit to the gate of the sixth transistor, wherein the eighth transistor is a diode-connected transistor.

20. The ESD protection circuit of claim 18, further comprising:

a ninth transistor, wherein a drain of the ninth transistor is coupled with the gate of the sixth transistor, a source and a gate of the ninth transistor are configured to receive the low operating voltage in the normal operation period; and a tenth transistor, wherein a drain of the tenth transistor is coupled with the source of the fourth transistor, a source and a gate of the tenth transistor are configured to receive the low operating voltage in the normal operation period.

* * * * *